United States Patent [19]

Strangio

[11] Patent Number: 5,280,251

[45] Date of Patent: Jan. 18, 1994

[54] CONTINUITY ANALYSIS SYSTEM WITH GRAPHIC WIRING DISPLAY

[75] Inventor: Christopher E. Strangio, Arlington, Mass.

[73] Assignee: CAMI Research, Inc., Arlington, Mass.

[21] Appl. No.: 788,990

[22] Filed: Nov. 7, 1991

[51] Int. Cl.⁵ .................................... G01R 31/08
[52] U.S. Cl. .................................... 324/539; 324/66; 324/133
[58] Field of Search ............... 324/539, 540, 542, 133, 324/66

[56] References Cited

U.S. PATENT DOCUMENTS

| | | | |
|---|---|---|---|
| 3,250,992 | 5/1964 | Cronkite et al. | 324/66 |
| 3,492,571 | 1/1970 | Desler | 324/51 |
| 3,902,026 | 8/1975 | Rogers et al. | 324/66 X |
| 4,218,745 | 8/1980 | Perkins | 364/489 |
| 4,271,388 | 6/1981 | Schäling | 324/542 |
| 4,375,050 | 2/1983 | Helgerson | 324/51 |
| 4,389,694 | 6/1983 | Cornwell, Jr. | 324/539 X |
| 4,434,489 | 2/1984 | Blyth | 340/705 |
| 4,459,695 | 7/1984 | Barratt | 371/25 |
| 4,620,282 | 10/1986 | Shelley | 364/489 |
| 4,643,890 | 2/1987 | Hechtman et al. | 29/846 |
| 4,698,585 | 10/1987 | Herman et al. | 324/66 |
| 4,736,158 | 4/1988 | McCartney | 324/66 |
| 4,772,845 | 9/1988 | Scott | 324/66 |
| 4,782,273 | 11/1988 | Moynagh | 318/568 |
| 4,814,693 | 3/1989 | Coben | 324/66 |
| 4,837,488 | 6/1989 | Donahue | 324/66 |
| 4,853,888 | 8/1989 | Lata et al. | 364/900 |
| 4,855,896 | 8/1989 | Oho et al. | 364/138 |
| 4,859,953 | 8/1989 | Young et al. | 324/539 |
| 4,901,003 | 2/1990 | Clegg | 324/66 |
| 4,901,004 | 2/1990 | King | 324/66 |
| 4,916,444 | 4/1990 | King | 340/825.490 |
| 4,937,519 | 6/1990 | Fields, III | 324/66 |

OTHER PUBLICATIONS

Advertisement: CT-6410 American Reliance, Inc.
Advertisement: G-50, etc. Checksum.
Advertisement: ISM 1000 Golden Harvest Electronics, Inc.
Advertisement: IVIS4,etc. Weetech.
Advertisement: 400-C Cablemaster.
Advertisement: Signature 1000/2000 Cirris Sys. Corp.
Advertisement: Cable/Continuity Test Set Beta Automation, Inc.
Advertisement: Dynalab 1024 Dynalab, Inc.

*Primary Examiner*—Kenneth A. Wieder
*Assistant Examiner*—Glenn W. Brown
*Attorney, Agent, or Firm*—Stephen G. Matzuk

[57] ABSTRACT

A multi-conductor cable tester and continuity analysis system having two groups of connector sockets wherein each group of connector sockets includes a plurality of different connector sockets designed to mate with the connector ends of the cable under test. An end of the multi-conductor cable is inserted into one cable socket from each socket group and the interconnection between the inserted cable ends is automatically determined by the system which interrogates each connected end of the cable separately, revealing unidirectional coupled data paths as may be provided with diodes or other electronic components. Additionally, the system compares the determined bi-directional continuity with previously stored cable continuity data corresponding to different, known cables and provides reference to one of the cables corresponding to the pre-stored cable data. Further cable embodiments provide automatic cable socket determination, continuity matrix display and cable test data analysis indicating the compatibility of the cable-under-test to the equipment to be interconnected.

33 Claims, 9 Drawing Sheets

Figure 5A
Test Cable

(A) → 220 Acquire Continuity Matrix for Cable in Fixture (see Subroutine 1) → 222 Display "Test Data Acquired" → (R)

Figure 5B
Continuous Test

(B) → 230 Acquire Continuity Matrix for Cable in Fixture (see Subroutine 1) → 232 Save Continuity Matrix in Buffer → 234 Acquire Continuity Matrix Again → 236 Compare to Buffer → (≠) → 237 Update Error Tally → 238 Terminate Continuous Test? — Yes → 239 Display Error Report → (R); No → back to 234

(=) → 238

Figure 4
Subroutine 1

Begin → 240 Send Stimulus Pattern to Stimulus Register → 242 Send END-OF-PATTERN Code to Load Response Register → 244 Readback Response Pattern from Response Register → 246 Store Response Pattern as Continuity Matrix in Memory → 248 All Test Points Checked? — No → back to 240; Yes → End

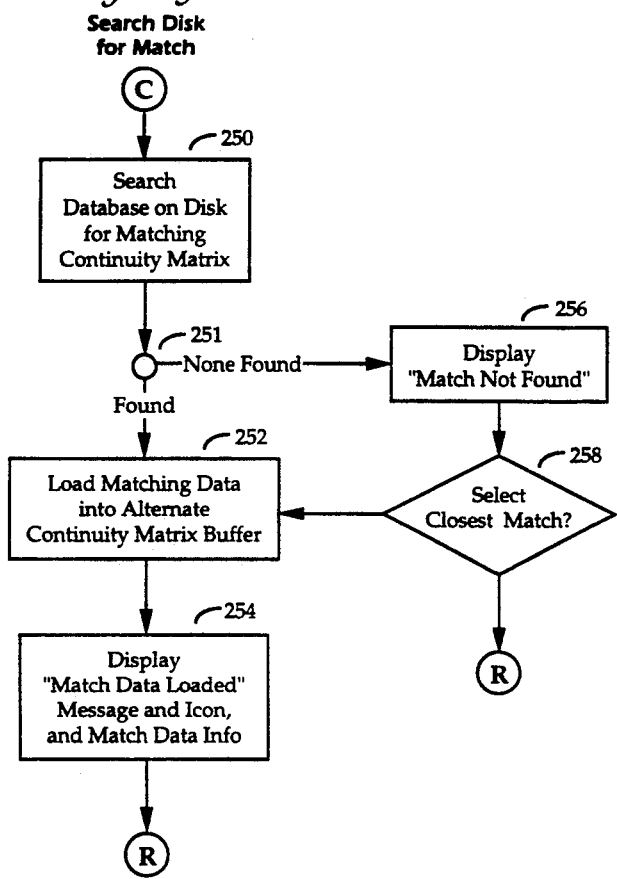
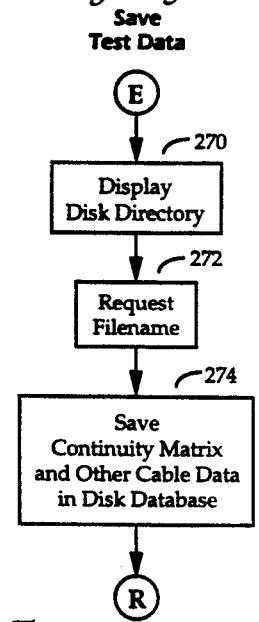
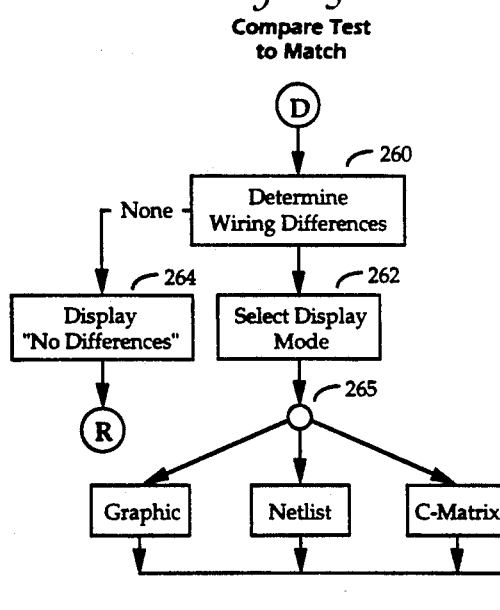
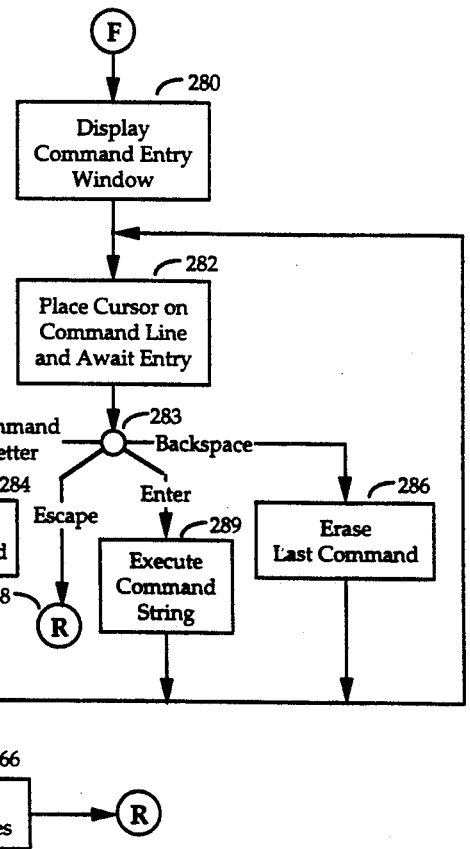

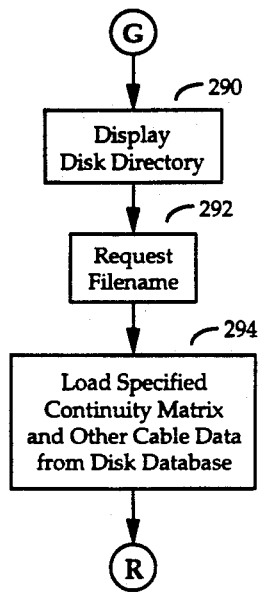
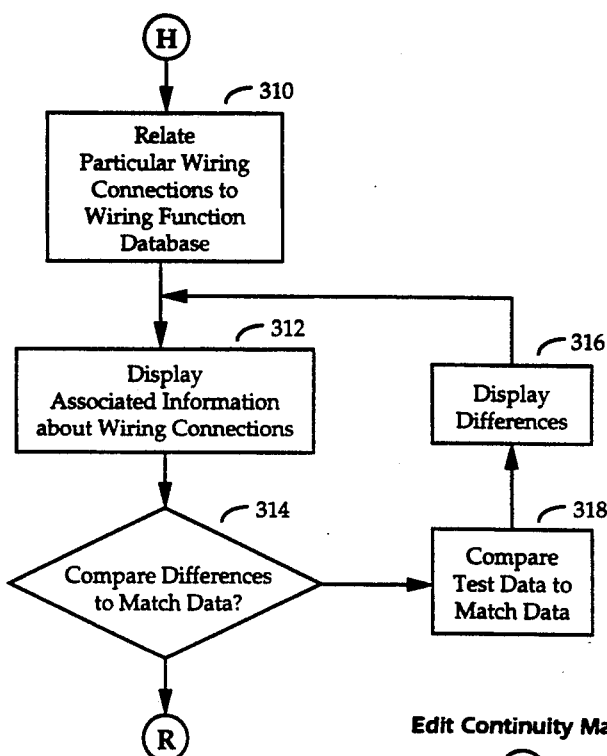
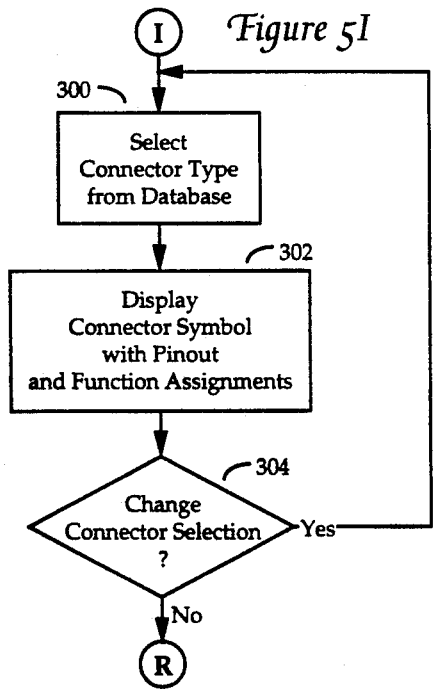
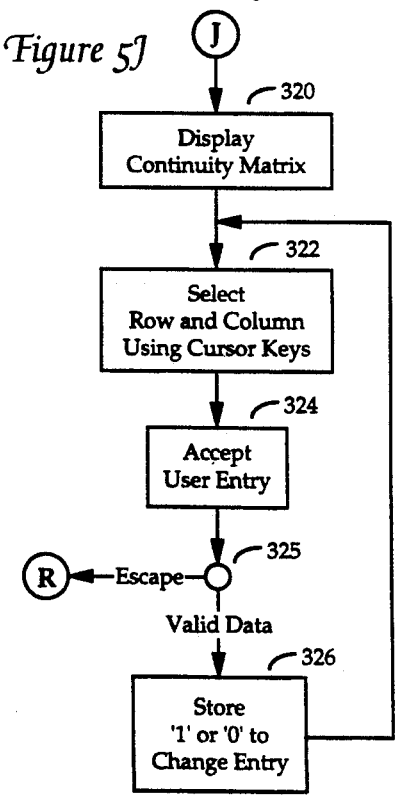

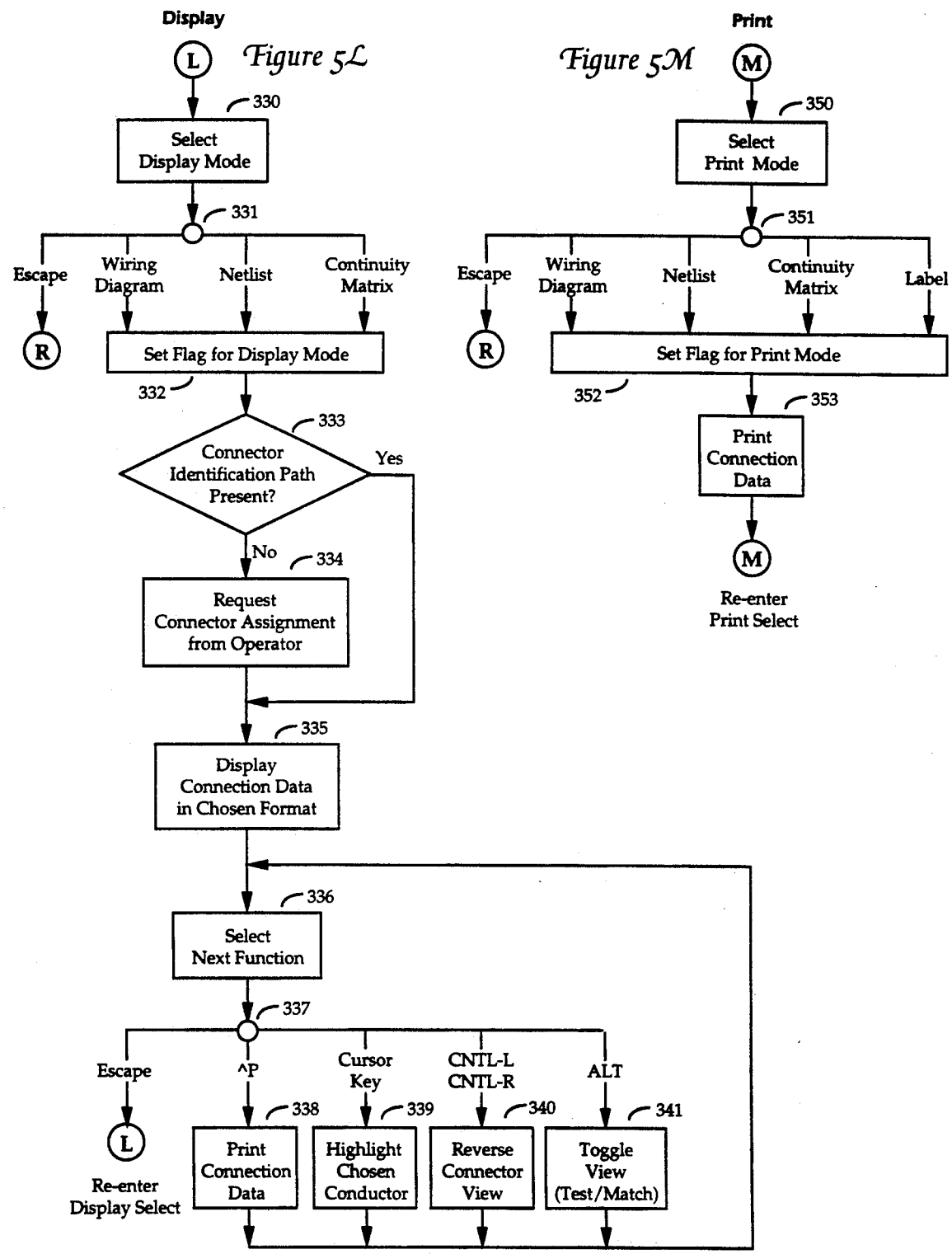

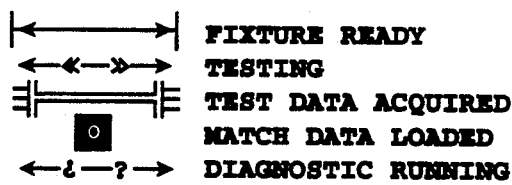

FIXTURE READY
TESTING
TEST DATA ACQUIRED
MATCH DATA LOADED
DIAGNOSTIC RUNNING

Typical Advisory Message:

*Communications error detected.*
*Check connectons and press*
*RETURN to retry, or ESC to exit.*

*Figure 6*

```
              Response
           A1  A3  B1  B3
         A0  A2  B0  B2
      A0  1 0 0 0 0 0 0 0
      A1  0 1 0 0 0 0 0 0
  s   A2  0 0 1 0 0 0 0 0
  u   A3  0 0 0 1 0 0 0 0
  l   B0  0 0 0 0 1 0 0 0
  u   B1  0 0 0 0 0 1 0 0
  m   B2  0 0 0 0 0 0 1 0
  t   B3  0 0 0 0 0 0 0 1
  S
```

*Figure 7A*

```
              Response
           A1  A3  B1  B3
         A0  A2  B0  B2
      A0  1 0 0 0 1 0 0 0
      A1  0 1 0 0 0 1 0 0
  s   A2  0 0 1 0 0 0 1 0
  u   A3  0 0 0 1 0 0 0 1
  l   B0  1 0 0 0 1 0 0 0
  u   B1  0 1 0 0 0 1 0 0
  m   B2  0 0 1 0 0 0 1 0
  t   B3  0 0 0 1 0 0 0 1
  S
```

*Figure 7B*

```
              Response
           A1  A3  B1  B3
         A0  A2  B0  B2
      A0  1 1 0 0 0 0 0 0
      A1  1 1 0 0 0 0 0 0
  s   A2  0 0 1 0 0 0 0 1
  u   A3  0 0 0 1 0 1 1 0
  l   B0  0 0 1 0 1 0 0 1
  u   B1  0 0 0 1 0 1 1 0
  m   B2  0 0 0 1 0 1 1 0
  t   B3  0 0 1 0 0 0 0 1
  S
```

*Figure 7C*

Null
(no connections
in netlist)

A0 : A1
A2 : B3
A3 : B1 : B2
B0 > A2 > B3    Diode Present

*Figure 8C*

No Cable Connected
(the Identity matrix)

Straight-Through Cable

Complex Internal Wiring

CONTINUITY ANALYSIS SYSTEM WITH GRAPHIC WIRING DISPLAY

FIELD OF THE INVENTION

The present invention relates to continuity analysis systems, in particular to cable testers having automated sequences and data analysis.

BACKGROUND OF THE INVENTION

The variety of multi-conductor cables including those that have different connector types terminating the ends have virtually an unlimited combination of connector pin connections or combinations, and thus cannot be quickly or rapidly tested to determine their continuity without reference to specific cable data. Furthermore, the proliferation of complex equipment to be interconnected makes cable verification an increasingly recurrent task. Moreover, identification of the particular cable function or interconnect is necessary to determine the corresponding pin connection information, which determination is frequently unavailable or time consuming to provide.

A great many modern computer cables do include internal wiring. Worse, the internal wiring is sealed in molded connectors that are identical in appearance to other cables that have different internal wiring. Thus, it is impossible to differentiate certain cable types by appearance only. As a consequence, many cables that look right for an application and fit everything properly do not work, leading to confusion, tedious debugging, and possible ascribing the fault to a computer or peripheral to which the cable connects, in turn leading to disassembly of the computer or peripheral In addition to wasted time, damage may be done to the unnecessarily-opened equipment in attempting to solve the problem.

Cables also occasionally incorporate particular electronic components, such as diodes, at the connectors to provide a form of equipment interface or adapter to permit communication between equipment not originally intended. Such electronic components are inadequately detected or measured by existing cable testers which typically interrogate the data path by placing interrogation signals only on one connector and receiving signals from the second connector. Since cables having direction related continuity will provide different continuity depending on which connector the interrogation signal is applied and the direction or polarity of the interrogation signal. Thus, cable testers adapted to perform continuity measurements on some cables will provide incomplete or erroneous findings.

SUMMARY OF THE INVENTION

The cable tester according to one embodiment of the present invention connects as a peripheral to a computer such as a personal computer, and includes two groups of cable connectors to which the cable-under-test is connected to provide determination of the particular connectors to which the cable-under-test is connected and interrogate the cable in two directions to determine the continuity of the cable-under-test. The computer provides further database resources wherein the peripherally controlled external housing having the connector groups is controlled to provide the desired cable interrogation and detected signals, and further the computer provides database information relating to other cable continuity information, wherein the cable-under-test may be compared relative to pre-stored reference cable data and a variety of determinations thereby made.

Further embodiments of the present invention provide high level operator interaction wherein the equipment to be interconnected by the cable-under-test is specified and the computer database provides the corresponding cable information to be presented in convenient graphic form to the operator as wiring lists, netlists and/or continuity matrices. Accordingly cables are selected and tested in the peripheral cable testing fixture and matched to the database to determine if the particular cable tested will provide the interface requirements between the equipment to be connected. Alternatively, unknown cables may be interconnected to the testing fixture and tested wherein the resulting continuity information is compared to resident database information and the correspondingly known cable type is identified. A peripherally-connected printer is included for printing labels that have the cable identification thereon to be applied to the cable-under-test. Further features of the present invention include complete graphic representation of the cable continuity and operator prompts to provide operator interaction with the testing process and editing facilities wherein database information is edited and new information added. Thus, the cable tester according to the present invention provides rapid cable testing and indication of the compatibility of the cable-under-test for a specific application. Moreover, the system according to the present invention can analyze any wiring network, such as checking the continuity on a bare printed circuit board or on the backplane of a computer.

BRIEF DESCRIPTION OF THE DRAWING

These and other features will be further understood by reading the following Detailed Description together with the Drawing, wherein:

FIG. 4 is a flowchart of continuity acquisition subroutine according to one embodiment of the present invention;

FIGS. 5A-5J and 5L-5Q are flowcharts of operator selected operations according to one embodiment of the present invention;

FIG. 6 is a drawing of representative screen icons displayed during the operation of the embodiment of the present invention according to FIGS. 3, 4, and 5;

FIGS. 7A-7C are continuity matrix representation according to one embodiment of the present invention;

FIGS. 8A-8C are representative netlists generated according to one embodiment of the present invention corresponding to the continuity matrices of FIGS. 7A-7C; and FIGS. 9A-9C are representative graphic wiring diagrams according to one embodiment of the present invention corresponding to the continuity matrices of FIGS. 7A-7C.

DETAILED DESCRIPTION OF THE INVENTION

Description of the Structure

Figure 1:
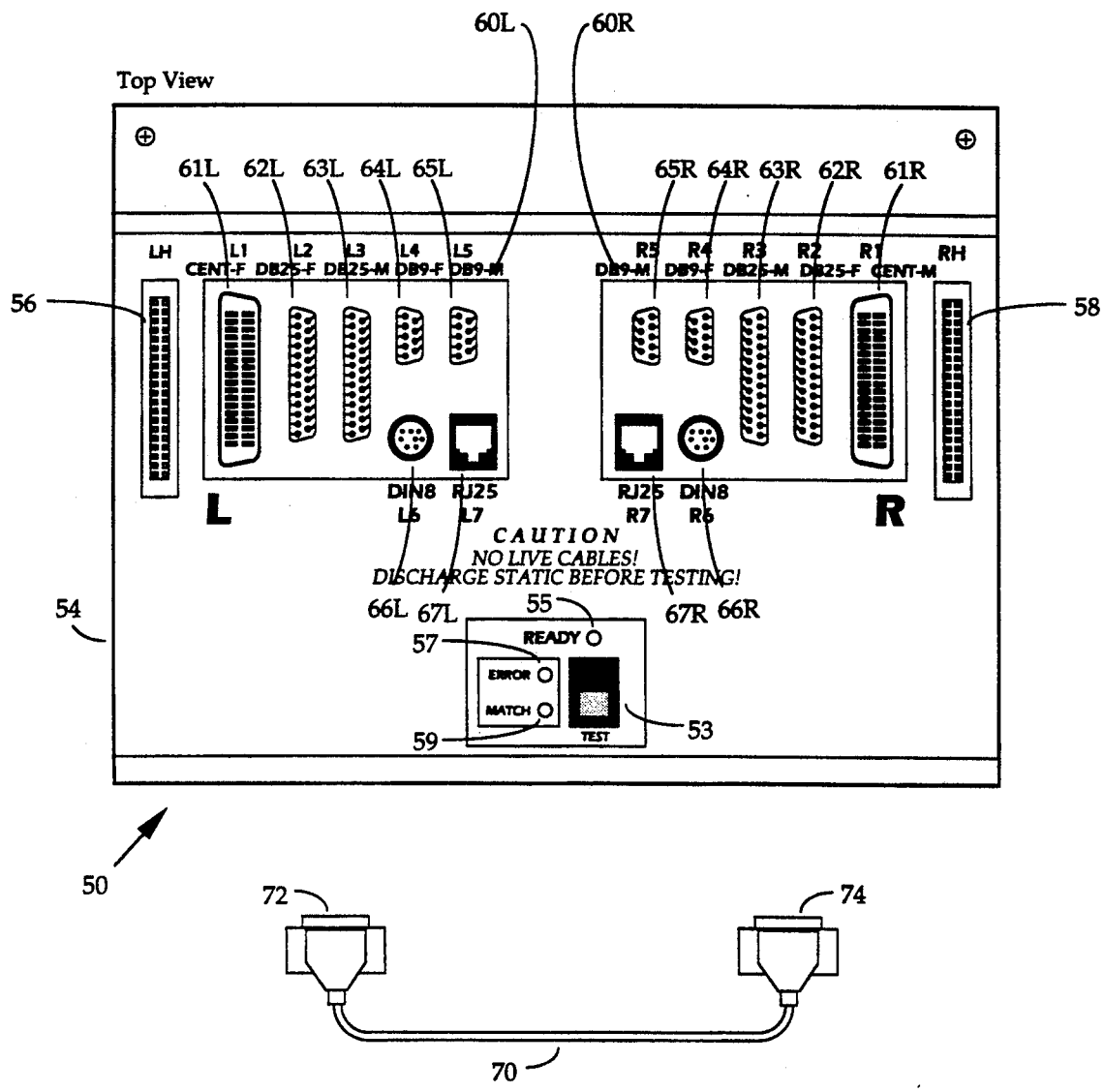
FIG. 1 is a plan view of a test fixture housing according to one embodiment of the present invention.
Figure 2:
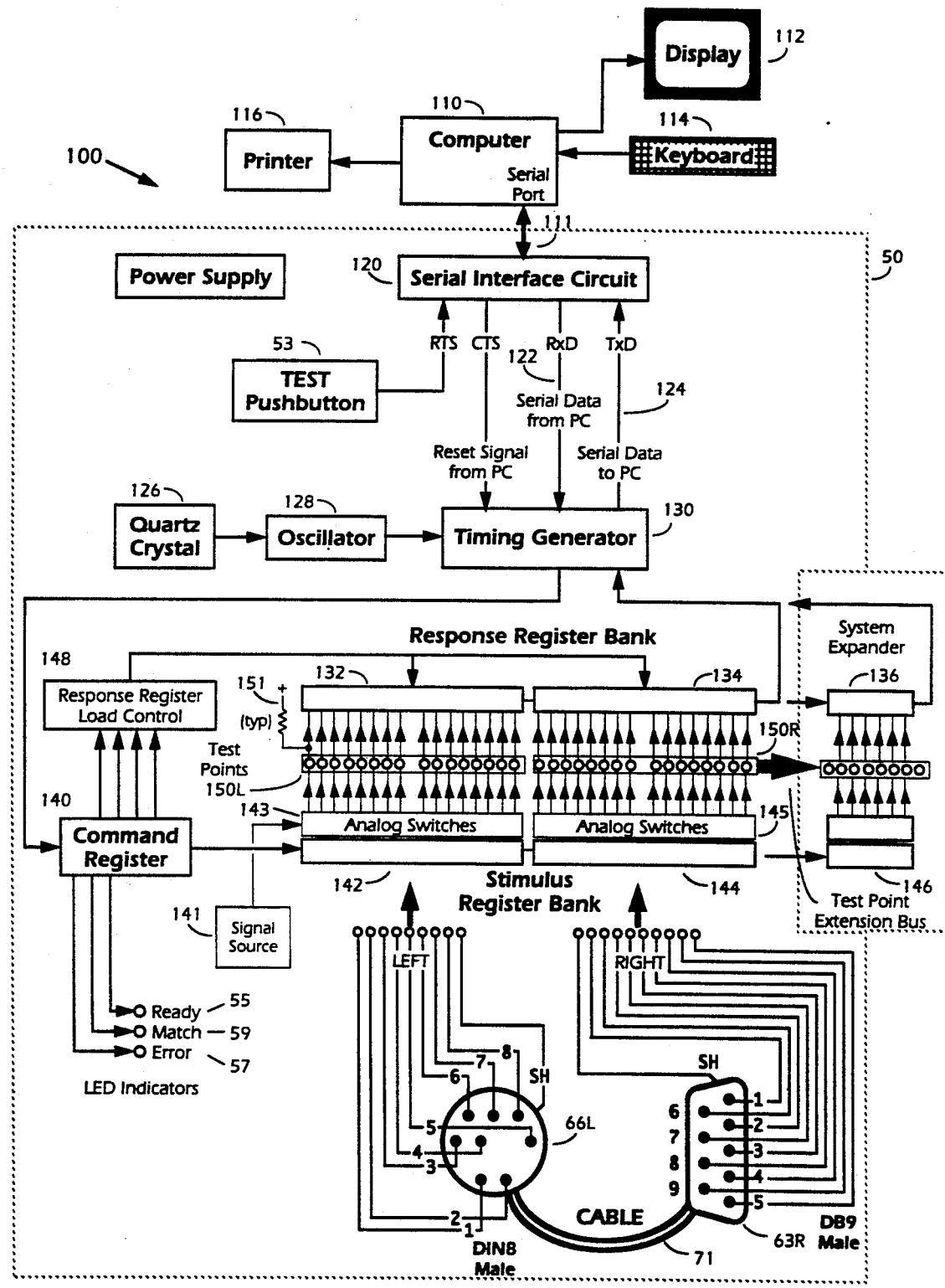
FIG. 2 is a block diagram of one embodiment of the present invention.

The cable tester according to one embodiment of the present invention comprises a test fixture 50 as shown in FIG. 1, comprising a computer peripheral including an external housing with an internal circuit board and cable connectors disposed thereon, an interface cable, and a software control program, alone or with a computer operating system, to be loaded into the computer 110 (FIG. 2) or equivalent. The test fixture circuit board (not shown) is substantially enclosed by the housing 54 and includes thereon two groups of connectors, 60L and 60R. Each group of connectors 60L and 60R include a plurality of different connectors 61L . . . 67L and 61R . . . 67R which mate with the connectors 72 and 74 of a selected cable-under-test 70. The cable tester includes connections to a test point extension bus by connectors 56 and 58, as explained further below. The connectors included in the groups 60L and 60R comprise the most popular interface connectors, e.g. 36-pin Centronics TM, DB-25, DB-9, DIN-8, and RJ-44 telephone jack connectors. Both genders of the connectors may also be included in each group 60L and 60R. Accordingly, it is envisioned that both ends of a multi-conductor cable comprising connectors of any type or gender are connected to the test fixture 50 connectors selected from 60L and 60R, wherein the test fixture 50 is controlled by the computer 110 to carry out the test procedure, determining the point-to-point continuity of every pin at each end of the cable. As described further below, the computer includes a control program which offers the operator a selection of screen display 112 screens, including the visual graphic display of cable wiring (FIGS. 9A-9C), identifies the cable type if the wiring is a common (previously known) configuration, and permits comparison against a pre-defined cable for pass/no pass testing.

The total compliment of 64 test points is divided into two equal test point busses of 32 conductors each, 150L and 150R. The connectors on one side, e.g. 60L, are wired in parallel to the test point bus, in this case 150L. Because only one connector on a side will be used at any time, and because each connector shell can be uniquely identified either automatically by a continuity path through the cable's shield or manually by User entry, there will never be any question as to which connector type to draw on the screen display 112 when the graphic wiring is shown, or to record when cable data is stored in the database Additional connector types not available in the standard system may be linked to the test point bus by optional connector extension cards (not shown) that will connect to the Left or Right bus extenders 56 and 58. Typically, the connector extension cards contain additional standard connector configurations as well as a breadboard card so that Users can attach their own custom connectors or other types that are not commonly available. In any case, the connector extension cards extend only 32 test points on the left and 32 on the right.

Yet another option will be an electronic circuit card in a separate housing (not shown) that will also join to the left and right bus extenders. This is called a "System Expander" (not extender). The System Expander including shift registers 136 and 146, increases the number of test points from 64 to 192 (adding 128 test points) or more so that cables or backplanes with a very large number of conductors can be accommodated.

A pushbutton 53 functionally defined by the software, provides immediate operator control of the test operation, such as permitting triggering a retest by depressing the pushbutton, without requiring computer keyboard 114 action by the operator.

The block diagram 100 of one embodiment of the present invention described illustrates the test fixture 50 interconnected to the computer 110 via a serial port and the corresponding serial data cable 111 and to the cable-under-test 71 via connectors 66L and 63R. Data transfer to and from the computer 110 is made via a serial interface circuit 120 which communicates with the test pushbutton 53 and timing generator 130, which accepts the received data 122 and provides the transmit data 124 to the serial interface circuit. The timing generator delivers the received data, including the stimulus pattern, to multi-stage serial-in parallel-out shift registers 140, 142 and 144, the first stage (8-bits) of which is a command register 140. The stimulus signal pattern typically comprises a single binary one among the remaining binary signals having a zero value. As the stimulus pattern is shifted through the serial-in parallel-out shift registers 142 and 144, data is presented on the parallel data output leads to test points 150L and 150R, which connects to the left and right group of test connectors 60L and 60R (FIG. 1), respectively.

The connectors are connected in parallel wherein all pin number 1 connector connections are connected to the same test point, as are all pin number 2 connections connected to the same test point for each group 60L and 60R. The relating of the connector pin number connection to the respective shift register parallel output lead is provided by mapping (the relative serial position of the stimulus and response signals with the pin connections) in the computer 110. While the stimulus signals are applied by the registers 142 and 144 and subsequently onto the test points via analog switches 143 and 145, response signals are simultaneously captured by a response register bank comprising multi-stage parallel-in serial-out shift registers 132 and 134 upon receipt of a load signal from local control register 148. The parallel input leads of the registers 132 and 134 are connected to the corresponding analog switches 143 and 145 parallel output signal leads as well as the test points 150L and 150R. The response register bank receives the signals as produced directly by the stimulus register bank via the analog switch [drivers] as well as the signals provided via the cable 71 under test as via the pin connections of the connectors, e.g. 66L and 63R, wherein the received data is serialized and transmitted to the computer 110 via the serial interface circuit 120 and the timing generator 130. The timing generator also receives time based signals from a crystal 126 controlled oscillator 128. The Command Register 140 is an 8-bit register that is appended to the most-significant-bit-end of the stimulus register and whose purpose is to capture a control word transmitted from the computer 110. In the current embodiment of the invention, this control word, which occurs at the end of each stimulus pattern, consists of four binary one bits which denote the encoded "load" command for the response register, three individual bits used to activate the LED lamps 55, 57, and 59 when appropriate, and one unassigned bit. The pattern of four successive binary one digits is detected by a four-input logic AND gate that makes up the Response Register Load Control 148. The output of the Response Register Load Control is asserted only when four successive binary ones appear in the Command Register 140. Under all other conditions, the output is de-asserted. Stimulus pattern data shifted through the command register 140 will at most have only a single binary one bit in succession during normal data interchange to extract the continuity matrix from the cable-under-test. Thus, accidental assertion of the "load" command due to random data passing through the Command Register 140 will be impossible.

The two ends of a multi-conductor cable may be considered topologically to be a single, large matrix of pins whose total number is the sum of the number of pins at each end of the cable. For example, a cable with a DB-9 connector at one end (9 pins) and a DIN-8 connector at the other end (8 pins) will form a square matrix of 17×17 (for the seventeen test points). Typically for a serial interface cable, many of the seventeen test points will be null (not connected), and are thus present only to conform to the physical construction of the connector.

Thus to determine the internal connection circuit of the cable under test, the continuity of every test point must be measured with respect to that of every other test point so that signals are transmitted to and received from every test point. Regarding the connection of the cable 71 in FIG. 2, the test fixture would sequentially connect two test point pairs A0 to A0, A0 to A1, A0 to A2, ... B7 to B5, B7 to B6, and B7 to B7 in response to the sequential application of stimulus signals. The data from this test procedure is used to form a continuity matrix wherein the rows relate to the test stimulus signals and the columns are the corresponding response signals wherein equal numbers of rows and columns corresponding to the same numbered test points. Typically the total number of test points in the groups 150L and 150R are large enough to accommodate the two of the largest connectors which the cable-under-test is expected to mate with. However, connectors having pins in excess of the number of test points available will have a selected subset of pins connected to the test points. The preferred embodiment has a configuration of 64 test points divided into two 32 bit groups corresponding to the left group and right group of connectors 60L and 60R (FIG. 1). A 36-pin Centronics ™ connector will typically have the low-order pins connected to the test points. Alternately, for larger cables, the number of test points may be increased to an arbitrarily large value to accommodate many more conductor circuits. This is done by (externally) increasing the length of the stimulus and response registers using an expander system including registers 136 and 146 described above, and applying appropriately modified stimulus patterns to the lengthened registers.

A sequence of serialized 8-bit-long data words are provided by the computer 110 via the serial interface circuit 120, the timing generator 130 and the command register 140 to the stimulus register bank including serial-to-parallel registers 142 and 144. Typically, the excitation signal pattern comprises a single binary one among the remaining binary signals having a zero value. For a 64-bit stimulus signal, this would provide a single one surrounded by 63 binary zero digits. A binary one signal activates a corresponding analog switch (136, 146) which in turns drives a single test point (of the group 150L and 150R) in the test matrix to zero volts, the remaining test points whose corresponding analog switch receives a binary zero, are undriven and are pulled to a logic one by a resistor to a plus voltage (typically +5 volts). Thus, if no connections exist between test points, only the driven test point will show zero volts in the response signal, while all other test points will remain pulled up to a logic one. Thus, if connections exist through the cables or within the cable connectors, the active test point will pull the corresponding test point to which it is connected to a logic zero, indicating the presence of the circuit paths. When the cable or the cable connectors include additional circuit elements, such as diodes, the cable conductivity matrix will be asymmetrical, wherein a conducted path or logic one will be indicated when the connection is interrogated in one direction, and will provide a logic zero when interrogated in the opposite electrical direction.

The present embodiment of the invention, in providing two-state conductivity information from a cable of either conduct or non-conduct, utilizes a current driver 141 comprising of a fixed resistor, a voltage source, and ground, to provide a fixed test current. The conductivity/non-conductivity threshold is set approximately by the fixed resistor value and the voltage threshold of the response register, and is set approximately at 50,000 ohms. However, the present invention includes replacing the fixed resistor and voltage source by a variable source of current, the particular resistance or impedance of the conductive path selected by the stimulus pattern could be exactly measured, thus permitting measurements on a cable that go beyond simple continuity.

The cable-under-test response signal is captured by the parallel-loadable response register bank comprising shift registers 132 and 134 wherein the data is serialized and transmitted back to the computer 110 in several 8-bit serialized data bytes. Typically, transfer of 8-bit stimulus data signals to the fixture 50 will be alternated with the exchange of 8-bit response signals from the fixture 50 to avoid exceeding the buffer capacity of a typical computer serial port buffer and registers. When simultaneous transfer of stimulus and response signals are possible, the transfer is monitored by the corresponding serial interface circuit and computer 110 internal interface circuit (not shown) so that the complete and accurate data transfer is provided. The command register 140 comprises a shift register wherein the last 8-bit transmission from the computer (ninth for a 64-bit test point system) contains a 8-bit command word. The most significant 4 bits of the command word are decoded by the response register load control circuit 148 which causes the shift registers 132 and 134 to load the signals from the test points. Furthermore, the least significant 4 bits of the command word provide control of the display lamps 55, 57 and 59 indicating a ready condition, error condition, and match condition respectively.

Thus, a 64-bit excitation signal comprises a total of nine 8-bit transmissions, and in turn makes up the excitation group, which originates from the computer 110 under software control. Similarly, there will be a response group signal returned to the computer 110 comprising eight 8-bit transmissions from the test fixture. In embodiments having alternating transmission of 8-bit portions of the stimulus group, the ninth byte of the response group should contain no data (OOH) and may be checked by the computer to confirm a complete emptying of the response register bank for error detecting purposes.

Description of the Flowcharts

Figure 3:
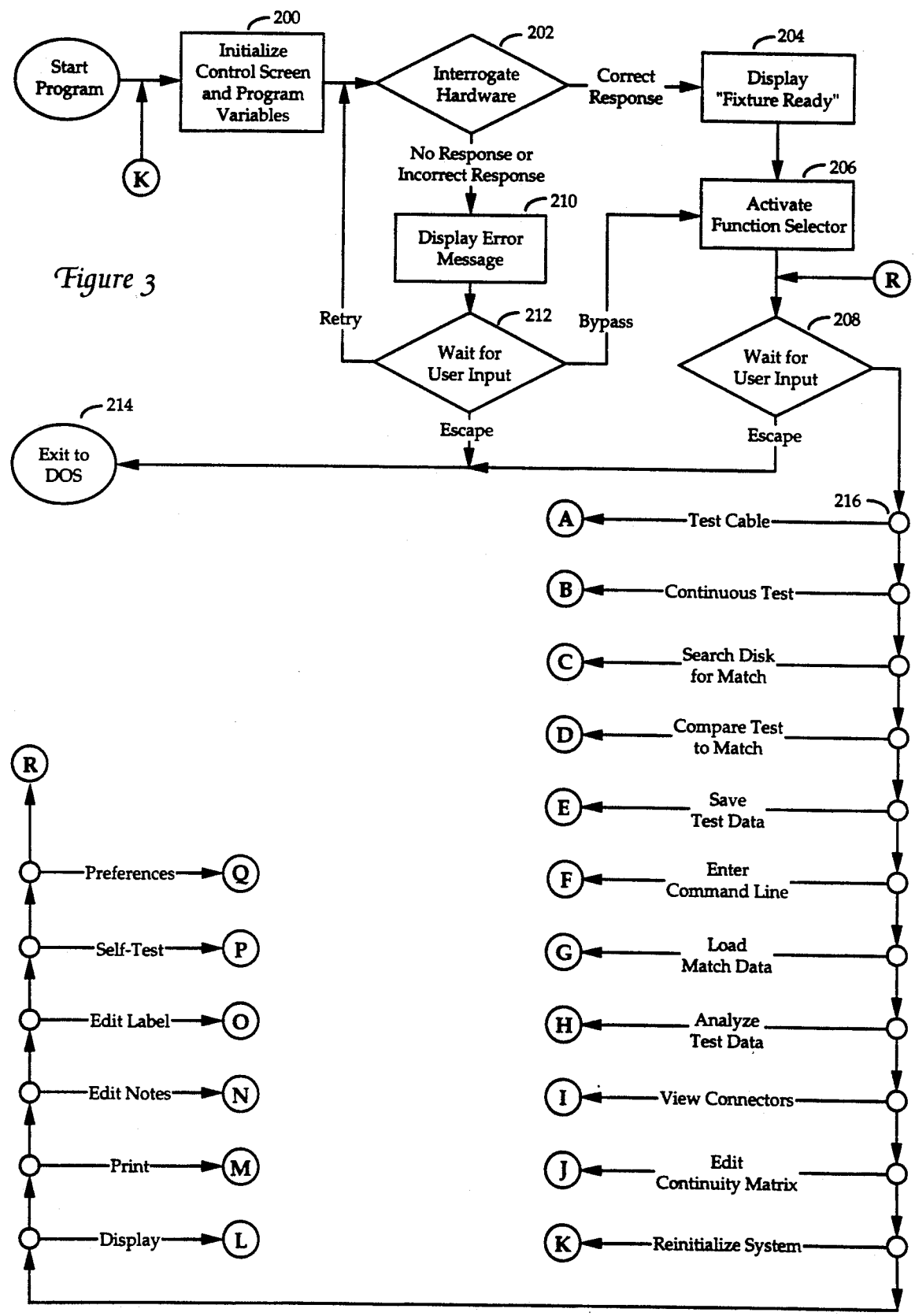
FIG. 3 is a flowchart of the primary functions according to one embodiment of the present invention.

The functions of the system according to one embodiment of the present invention are illustrated in the flowcharts of FIGS. 3, 4, and 5. Upon beginning the program, the program and control screen are initialized, and program variables set to default User-specified values by reading the contents of a Preferences file from disk, 200. The status of the test fixture is provided by polling the serial channel of the computer 202 to determine if the test fixture is connected. If the housing is connected and responds correctly to a test sequence in which all test points, 150L and 150R, are interrogated, "Fixture Ready" is shown 204 on the display 112 with the corresponding icon, as illustrated in FIG. 6. If no response is provided, an error message 210 is shown to indicate this condition, and no icon is shown. If an incorrect response is returned, a different error message 210 is shown it make the operator aware that the hardware is malfunctioning. The error message provided on display 112 also suggests what may be done to correct the problem, such as "be sure cable is detached before starting" 210. In the event of a non-response or erroneous response condition to the initial hardware interrogation 202, the Operator has three alternative courses of action. First, Retry is possible causing re-entry into Step 202. Second, Bypass is possible, causing entry into Step 206. Third, Escape is possible in which the program is terminated and the computer restarts the resident operating system.

Bypass entry into 206 is useful in the event that the program is to be used without the hardware fixture attached to the computer. This allows the Operator to examine stored connection data, view connector diagrams, print stored connection data, and perform other operations that do not require the collection of new test data from a cable or electrical network.

Once it has been determined that the test fixture is ready and the appropriate confirmation message and icon are displayed 204, a function selector window is activated 206 on the display screen 112 that permits the Operator to choose from a variety of system functions 216 via keyboard 114.

Step 216, Function A

As illustrated in the flowchart shown in FIG. 5A, the Test Cable function is initiated by the acquisition of the continuity matrix 220. During the acquisition period the label "Testing—do not disconnect" is shown in the advisory message window of display 112, and the corresponding icon as illustrated in FIG. 6 is on and flashing. Typically, the acquisition process lasts several seconds during which communication with the computer 110 and the test fixture 50 occurs. That process is illustrated in Subroutine 1 of FIG. 4. The essential steps of the acquisition process include, first, the transmission of a stimulus pattern to the stimulus register, Step 240, followed by the End-Of Pattern code, Step 242, which prepares the Response Register for loading. Immediately following the End-Of-Pattern code, the response pattern is extracted from the response register 244 while simultaneously transmitting the next stimulus pattern to the stimulus register. When all 8-bit bytes that constitute the response pattern have been completely received by the computer 110, it is stored in memory, Step 246, and represents one complete row of the continuity matrix. Note that extraction of the response pattern while concurrently transmitting the next stimulus pattern saves considerable communications time in developing the continuity matrix.

One complete stimulus pattern/response pattern interchange with the test fixture 50 must occur for each test point that is being measured. Because each stimulus pattern and each response pattern contains a number of bits equal to the number of test points being measured, the complete continuity matrix will contain a quantity of entries that is the square of the number of test points.

In the present embodiment of the invention, each entry of the continuity matrix is a binary one or binary zero, indicating for a binary one that a connection exists between the test point identified by the row number and that identified by the column number. If the continuity matrix entry is binary zero, this indicates that no connection exists between the corresponding test points. The resistance threshold that defines the boundary between a connection and a non-connection is set by the value of the pull-up resistors 151 attached to the terminal points 150L and 150R, and by the electrical characteristics of the IC logic family that implements the stimulus and response registers. In general, the resistance threshold is approximately equal to the value of the pull-up resistors, but may be somewhat higher or lower depending on the logic voltage thresholds of the logic family that is used.

Step 216, Function B

The Continuous Test function provides for the detection of intermittent connections, as shown in FIG. 5B. In this case, the continuity matrix is acquired 230, and saved in a buffer 232. Immediately thereafter, the continuity matrix is reacquired 234 and compared to the data previously stored 236. If the cable or network continuity remains unchanged from the first acquisition to the second or any subsequent acquisitions, no change will be measured in the continuity matrix. This reacquisition and comparison process continues indefinitely until the Operator causes termination by pressing an appropriate key 238. While the continuity matrix is being continuously reacquired, the physical elements of the cable or network may be moved or stressed in any desired manner. If the internal conductors of a cable or wiring network are joined securely to the terminating connectors, the continuity matrix will not change from one acquisition to the next. However, a loose connection or broken wire will result in intermittent connections, causing the continuity matrix to change, perhaps in only one entry, from one acquisition to the next. In the event of this occurrence, an error tally will be maintained 237, and displayed, 239, in the error and advisory window of display 110 when the Continuous Test loop is terminated by the Operator.

Step 216, Function C

A great many variations in wiring may be expressed by the continuity matrix, with each variation corresponding to a particular cable type. To assist the Operator in characterizing and cataloging the many types of cables that may be encountered, a disk database is made available and contains the stored continuity matrix, connector types, and other information corresponding to many different cables. The Operator may add to this database at any time when new cable types are required. As shown in FIG. 5C, after the continuity matrix has been acquired from the cable-under-test, the database may be searched 250 for a corresponding cable type. If a match is found 251, all stored data associated with the match is loaded into a "Match" buffer in the program. This stored data includes the continuity matrix, connector gender and type at each end of a cable, a list of devices and applications for which this cable would be used, and additional text information that the Operator may have previously added to describe in greater detail the match cable. If a match is not found 251, the message "Match Not Found" is shown in the error and advisory window of the display 110. Failing an exact match, the Operator may choose to select the closest possible match 258. If either an identical match or the closest possible match is selected, the message "Match Data Loaded" is displayed, 254.

Step 216, Function D

In the case where cable test data extracted from the cable connected to the test fixture, and cable match data taken from the disk database do not match, it may be desirable for the Operator to know the details of where the cables are different. According to the flowchart of FIG. 5D, a comparison is made 260, and the operator may then select the display mode in which the differences will be illustrated 262. Choice of the Graphic display mode 265 will portray a wiring diagram of the test cable with differences in the match cable shown distinctly in flashing or highlighted wire lines 266. If the netlist mode is chosen 265, a wiring connection list is given with differences shown as flashing or inverse video text 266. If the Continuity Matrix mode is preferred 265, the differences between test and match cable data are shown as flashing or highlighted entries in the continuity matrix 266.

Step 216, Function E

Test data acquired from a cable attached to the test fixture may be saved in the disk database if desired according to the flowchart of FIG. 5E. To do so, the disk directory is first displayed 270 to show the Operator which filenames are already in use by the cable database. The Operator may then select a unique filename for the data to be saved 272, and store the cable information in the disk database 274 using the chosen filename.

Step 216, Function F

The control software operating on the computer 110 in conjunction with the test fixture 50, keyboard 114, display 112 and printer 116 provides a multitude of functions that are useful in a commercial or industrial environment where cables are tested. These functions are enumerated at Step 216. In many cases, it is desirable to perform a sequence of several functions in succession before completing the test of a particular cable. To facilitate this task, a command entry system is included in which each desired function is represented by a letter or symbol, possibly including one or more numeric arguments. The Operator may then enter on a command line a sequence of desired functions in the preferred order of execution. This command line, embodied by a sequence of letters and numbers, may be stored and subsequently recalled at the Operator's request, and interpreted by the software so that the command functions represented by the letters and numbers are executed automatically, in sequence, without Operator intervention.

When the command entry system is begun, FIG. 5F, the command entry window is displayed 280, and a cursor symbol is shown to denote where the next command may be entered 282. If the Operator enters a letter or symbol that corresponds to an assigned command 284, or a numeric argument associated with the previously entered command letter 284, the new entry will appear on the command line. The keyboard's Backspace key, or other suitably assigned key, will erase the previous command letter. When the command sequence is complete, the Operator may escape 288 to return to the function selection window. This process may be repeated at any time to add to, remove, or modify a previously entered command sequence. To execute the command sequence, the Operator may press the keyboard's Return or Enter key 289, or other suitable keyboard key, or press the pushbutton switch 53 installed on the test fixture 50.

Step 216, Function G

As described Function E starting in Step 270, cable test data may be saved in a disk database for later recall. In addition to searching the database for a match, as described by Function C, data for a specified cable may be directly loaded as the match data, without the benefit of a database search, by entry of its filename using Function G, FIG. 5G. When first started, this function displays the disk directory 290 to inform the Operator of the filenames that currently comprise the database. The Operator may then select the desired filename for loading 292, and trigger the loading of the cable data into the Match Data Buffer when ready by pressing an appropriate keyboard key, such as Enter or Return, 294.

Step 216, Function H

It is entirely possible that a cable-under-test may not have corresponding match data available in the database. Such a cable may have an unusual function, or the database may be deficient in its representation of cable types. Without match data available, the Operator may be deprived of the descriptive text that usually is associated with stored match data, and consequently may be unable to ascertain the function of the cable-under-test. To assist the Operator in learning how a cable may be used or in determining for which application a cable is suitable, Function H as shown in FIG. 5H provides an analysis of the cable, starting at Step 310. Based on the connector types and an Operator-entered electrical standard, such as RS232 or RS422, or on label markings taken from the cable, a wire-function database is accessed so that the pin number, function name (if any), signal direction, signal voltage range, and other signal information may be displayed 312 for Operator reference. If match data has been loaded, the Operator may choose to compare any differences between test data and match data 314, compare functional differences 318, and display appropriate wire-function information about the differences 316.

Step 216, Function I

As an aid to cable wiring and pin identification, the graphic image of common cable connectors may be displayed for operator reference. This process begins in Step 300, where the Operator selects the connector type of interest. This connector may be displayed 302 or printed. Concluding this, a different connector may be selected for display 304, or the display function terminated.

Step 216, Function J

In some cases, it is necessary to view or print the wiring of a cable that is not physically present and whose data is not stored in the database. In other cases, it may be desired to augment or modify the connection data for an existing cable. To achieve these results, Function J permits the continuity matrix to be edited. In particular, the continuity matrix is displayed 320 on display unit 110, a screen cursor is positioned over a desired entry in the continuity matrix using the cursor control keys 322, and the Operator enters the desired continuity state of binary one or binary zero 324. By repeating this function, wiring connection data may be systematically changed until the desired cable wiring data is achieved. The result may then be stored, recalled, displayed in graphic wiring format or netlist format, or subject to any other function or operation normally provided for cable data that is acquired from the test fixture.

Step 216, Function K

The control software may be reinitialized at any time by executing Function K. This is exactly equivalent to terminating the software and restarting it. When this happens, all program buffers are cleared, internal program variables are reinitialized, and the display screen 110 is erased and redrawn. This operation might be desirable to clear the program of test and match data in preparation for testing a new cable.

Step 216, Function L

The display of cable connection information is an important element of this invention, and is accomplished by Function L beginning in Step 330 of FIG. 5L. When cable test data has been acquired from the test fixture, or when match data is loaded from the database, the data may be displayed or printed in various formats for study and analysis. Three display formats are available 331. When the Operator selects the desired format, this format type is stored 332 so that subsequent display operations may correspond to the chosen format.

For most connector types 60L and 60R, a unique test point 150 is assigned to the connector housing as well as to each contact pin in the connector. In turn, the mating cable's connector housing is typically joined to a cable's internal shield conductor, resulting in a circuit path linking the connector housing at each end of a cable. Typically, the shield of each of the connectors in each of the groups 60L and 60R are connected to a unique test point among the test points 150L and 150R, and the connector pins are connected to the remaining test points. Thus, when a cable is installed between the left and right connector groups, 60L and 60R respectively, a connection path is established between the two test points that are assigned to the connector housings into which the cable has been attached. When the continuity matrix is acquired, it is possible to establish which two connectors from connector groups 60L and 60R are in use by noting which two connector test points are joined through the shield conductor. This decision takes place automatically 333 without requiring operator intervention. If, however, the shield conductor is not present or is not joined to the connector housings, the Operator is asked to indicate which two connectors are being used 334 for subsequent graphic display, cable comparison, and analysis.

When the connector usage has been established, the wiring data is displayed in the previously selected format 335. With the wiring display visible, the Operator may choose a variety of alternate functions 336 to help in visualizing the cable wiring. If it is desired to trace a particular wiring path, the Highlight Chosen Conductor selection 339 is made. In this case, one particular wire (for graphic wiring display), or one particular netlist connection (for netlist display), or one entry in the continuity matrix (for continuity matrix display) is shown in bold (extra bright) or with a different color (if a color display is available) to make it stand out from other entries. The Operator will, thus, easily be able to identify a specific connection among a possibly large number of different connections. By using the cursor control keys, the Operator can sequence forward or backward through all wiring connections that are shown, and in doing so highlight each individual wire path for easy tracing.

When using the graphic display mode, it is sometimes desirable to view a connector from the wiring side rather than from the contact side. The function Reverse Connector View 340 will redraw the graphic wiring display to accomplish this. Because this function provides a toggle action, executing it again restores the drawing to its original state. A small icon visible next to each cable connector shows the operator the direction from which the connector is being viewed, contact pin side or wiring side, so that there is no confusion about this point.

When match data has been loaded that represents wiring not exactly identical to the test data, the Operator may find it useful to directly compare the two different cable wiring diagrams, net lists, or continuity matrices. The function Toggle View 341 alternates the display between the match data and the test data so that small differences in the wiring may become readily apparent to the Operator. Applying the function once will switch the display to the alternate view (for example, changing the display from test data to match data), and applying it again will restore the display to its original view.

Any of the selected display formats or their modifications 339, 340, 341, may be printed 338 if desired to obtain hard-copy output of the display. When the Operator is finished viewing or printing wiring data with these functions, the display format select mode may be reentered to change from, for example, graphic wiring display to continuity matrix display. Alternately, the function selector window may be reentered.

Step 216, Function M

Printing of wiring data may take place at almost any time. Special prompts may be given from the currently active display or notes editing window, as shown in FIG. 5M. If necessary, the Operator is asked to select a print mode 350 at which time he chooses one of four print possibilities 351, or escapes the print function. The appropriate flag is set within the program 352 to specify what is to be printed, and the selected information is transmitted to the printer 353.

Step 216, Function N

An alphanumeric text area is associated with each wiring data file stored in the database. The Edit Notes function permits the initial entry and subsequent editing of this data, FIG. 5N. When previously entered wiring data is recalled, the alphanumeric text area will normally contain descriptive text that helps the operator understand the application of a particular cable, or contains dates, model or serial numbers, individual or company names, or other supportive information. When beginning an editing session, the notes flag is first examined 360 to ascertain whether match data will be edited or a test data text area created, 361. From this point, the notes editing window is opened, and the text may be entered or modified, 362. Notes may be printed 364, or the alternate wiring data notes edited 366. When notes editing is complete, the Operator may escape to return to the functions selector window.

Step 216, Function O

Figure 5N:
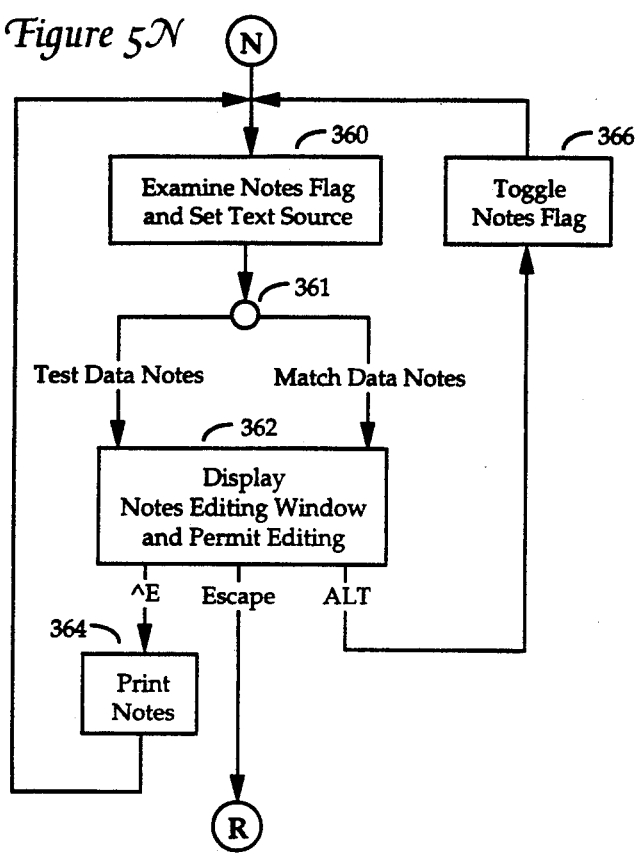
Figure 5O:
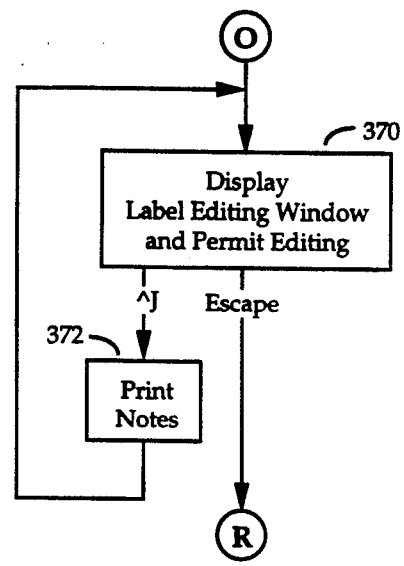
Figure 5P:
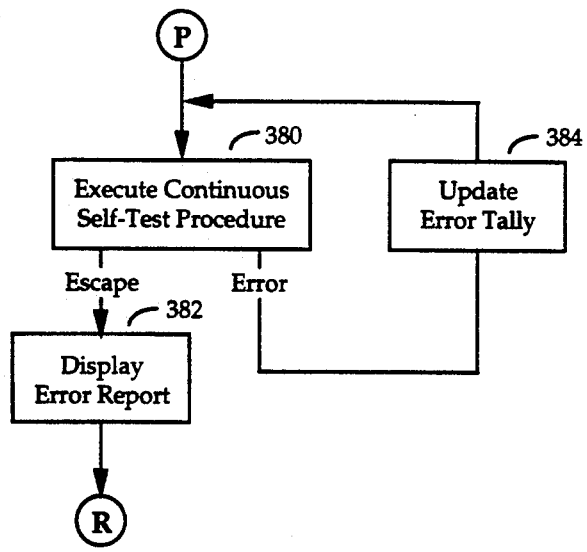

When testing a cable, it may be desirable to print a label on an adhesive label that may then be affixed to the cable for identification purposes. This label may contain alphanumeric text entered by the Operator, model or serial numbers, wiring or application information, or other supportive information. As shown in FIG. 5O, function 0 provides a label editing capability 370 which is operationally very similar to the notes editing function beginning at Step 360. Label data is linked with the other cable information that is stored in the database, so that recall of match data will also make available label text associated with the match data. Printing a label requires a suitable printing device that can handle adhesive label forms, or paper of a proper size that can be inserted into a label holder that attaches to the cable.

Step 216, Function P

The Self-Test function (shown in FIG. 5P) beginning at Step 380 applies a sequence of exercise signals to the test fixture to assure that its internal electronics are operating properly. If any errors are detected, an error tally 384 is incremented. The self-test continues indefinitely until the Operator stops it by pressing Escape. Upon termination of the self-test, an error report is displayed 382 to indicate the results of the self-test.

Step 216, Function Q

Figure 5Q:
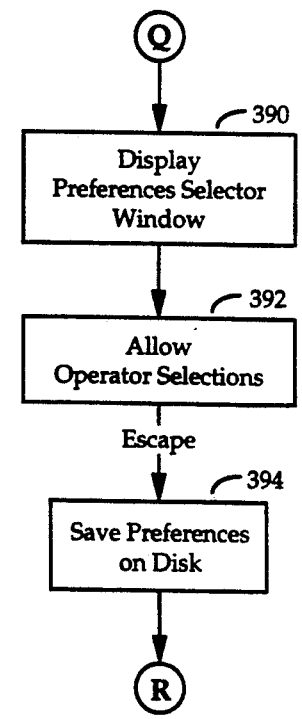

Certain Options are available to customize the control software for each particular operator. For example, the colors chosen to show wiring (when a color monitor is available) may be selected, or the directory location of the database may be chosen. The Preferences function beginning at Step 390 of FIG. 5Q provides this capability. Once begun, the Preferences function shows the available choices upon which the operator makes the desired selections 392. Following this, the Operator's preferences are stored in a special disk file 394 for future reference. Whenever the program is restarted, the preferences file is accessed so that the appropriate internal variables are initialized according to the Operator's desires.

Exemplary continuity matrices are shown in FIGS. 7A, 7B and 7C. When no cable is connected or the cable connections are broken, the matrix shown in FIG. 7A occurs wherein the rows correspond to the stimulus signal and the columns are the resulting response signals. When two connectors of a straight-through cable are connected to the test fixture, the conductivity matrix 7B occurs. When complex internal wiring of the cable and cable connectors occurs, including additional electrical components such as a diode, the conductivity matrix 7C results.

Netlists corresponding to no cable connection, straight through cable connection, and complex internal wiring connection are provided in FIGS. 8A, 8B and 8C.

According to one embodiment of the present invention, the wiring diagrams illustrated in FIGS. 9A, 9B and 9C are provided on the display 112 of the computer 110, as well as the netlist of FIGS. 8A–8C and the continuity matrices 7A–7C.

Modifications and substitutions made by those of ordinary skill in the art are considered to be within the scope of the present invention, which is not limited except by the claims which follow.

What is claimed is:

1. A bi-directional network analyzer for analyzing a network having signal paths between connections, comprising:
    a first transmitter for transmitting a first plurality of selected signals into said network from a first network connection;
    a first receiver for receiving said first selected signals from a second network connection;
    a second transmitter for transmitting a second plurality of selected signals into said network from said second network connection;
    a second receiver for receiving said second selected signals from said first network connection;
    means for determining the bi-directional continuity of said network according to said selected signals transmitted into said first and second network connections and received from said second and first network connections.

2. The bi-directional network analyzer of claim 1, wherein
    said means for determining provides signals corresponding to the bi-directional continuity of signal paths between a selected first test point of each of said first and second network connections with a second test point of said first and second connections.

3. The bi-directional network analyzer of claim 1, further including display means for providing a graphical representation according to said bi-directional continuity.

4. The bi-directional network analyzer of claim 1, wherein said selected signals transmitted by said first and second transmitter for transmitting is time-domain unique.

5. The bi-directional network analyzer of claim 1, further including
    local control means providing a control signal according to at least a portion of said selected signal, wherein said first and second receiver selectively receive said selected signals according to said control signal.

6. For use with cables having terminating connectors selected from a plurality of cable connector types characterized by a selected one of a cable connector shape, cable connector gender and a cable connector pin number, a cable tester comprising:
    a first set of mating connectors comprising a plurality of different mating connectors each having a selected mating connector shape, mating connector gender and mating connector pin numbering, wherein at least one of said different mating connectors mates with a first of said cable connector type;
    a second set of mating connectors comprising a plurality of different connectors each having a selected mating connector shape, mating connector gender and mating connector pin numbering, wherein at least one of said different mating connectors mates with a second of said cable connector type;

means for providing a signal to each of said plurality of mating connectors of said first set;

means for detecting a signal from one of said plurality of mating connectors from said second set;

means for determining the type of particular connector of each of said first and second set of mating connectors according to said detected signal from one of said plurality of second set mating connectors.

7. The cable tester of claim 6, wherein said signal provided to each of said plurality of mating connectors from said first set is applied to a cable connector shield connection, and said signal detected from one of said plurality of mating connectors from said second set is received from a cable connector shield connection.

8. The cable tester of claim 6, further including means for providing a signal to each of said plurality of mating connectors of said second set; and means for detecting a signal from one of said plurality of mating connectors from said first set.

9. The cable tester of claim 6, further including means for connecting additional mating connectors to said means for providing a signal and said means for detecting a signal.

10. The cable tester of claim 6, wherein said means for providing a signal comprises an internal shift-register and an external shift register for serially receiving a stimulus signal, and said means for detecting a signal comprises an internal shift-register and an external shift register for serially sending said detected signal.

11. Apparatus for testing a cable having a first and a second cable connector, each having a plurality of electrical connections, comprising:

a first tester connector for mating to said first cable connector and providing electrical connection to each of the electrical connections thereof;

a second tester connector for mating to said second cable connector and providing electrical connection to each of the electrical connections thereof;

memory means including data indicating a cable connection path between and among the connections of said first and second cable connectors;

means connected to said first and second tester connectors for providing data indicating the actual individual path cable connection between and among said first and second cable connectors; and means for detecting the concurrence of cable connection path and the actual individual path cable connection according to said data.

12. The apparatus of claim 11, further including means for storing said data wherein said memory means includes connection path data for a plurality of identified cables, and said means for detecting includes means for detecting a particular one of said identified cables.

13. The apparatus of claim 12, further including operator data entry means for providing cable connection path reference data to said memory means.

14. The apparatus of claim 12, further including data transfer means for storing actual cable connection data as connection path reference data.

15. The apparatus of claim 12, further including means for providing a label according to said particular detected one of said identified cables.

16. A network analyzer connected to a network having a plurality of multi-path connectors being connected to a plurality of signal paths, and each multi-path connector having a plurality of connections, comprising:

means for applying a stimulating signal to a first connection to a first path of said plurality of signal paths of a network first multi-path connector of the network;

means for detecting said first path according to a stimulating signal received at a second connection of said first multi-path connector at any position at said first multi-path connector relative to said first connection;

means for detecting said first path according to a stimulating signal received at at least one connection of a second multi-path connector of the network;

display means providing visual indication of the network first multi-path connector stimulus and detected connection to at least one other connection of said network first multi-path connector and to said at least one connection of said second multi-path connector.

17. The network analyzer of claim 16, wherein said display means includes means for providing at least one of a wire list, a netlist and a continuity matrix.

18. The network analyzer of claim 16, wherein said display means includes means for displaying information differences between the detected connection and previously stored data.

19. The network analyzer of claim 16, wherein said display means includes means for displaying text in relation to said visual indication of said detected connection.

20. A multi-mode cable tester, comprising:

operator input means;

a controller for providing a control signal in response to operator input; and a cable test fixture for receiving a plurality of connections from a selected cable-under-test, for stimulating a connection from said cable-under-test with a signal, and for detecting said signal on a different connection of said cable-under-test according to said control signal, wherein said multi-mode cable tester is to be operable in a mode selected from fixture ready, test cable once, continuous cable test, acquire test data, save test data, load cable match data, compare match data and self-test mode.

21. The multi-mode cable tester of claim 20, further including display means connected to said controller for displaying a selected one of a cable-under-test wiring, a netlist, and a continuity matrix.

22. The multi-mode cable tester of claim 20, further including means for providing an operator-selected sequence of a plurality of modes.

23. The multi-mode cable tester of claim 22, further including means for repetitively executing said operator-selected sequence of a plurality of modes.

24. The multi-mode cable tester of claim 23, further including pushbutton means for initiating said repetitive execution.

25. The multi-mode cable tester of claim 20, wherein said controller includes computer control means.

26. A method of testing a cable having a first and a second connector, each connector having a plurality of electrical connections, comprising the steps of:
- electrically stimulating each of the electrical connections of said first connector with a first selected signal;
- detecting said first selected signal at said second connector;
- electrically stimulating each of electrical connections of said second connector with a second selected signal at said first connector;
- detecting said second selected signal at said first connector;
- determining the bi-directional continuity of said cable according to said detected signals.

27. The method of claim 26, further including the steps of:
- comparing the bi-directional continuity with a plurality of previously stored representations of a cable continuity, and
- indicating the concurrence of said bi-directional continuity and one of said previously stored representations of cable continuity.

28. The method of claim 26, further including the step of
- displaying a continuity matrix of said cable according to said determined bi-directional continuity.

29. The method of claim 26, further including the step of
- selectively providing a mode of operation from the modes comprising: saving the bi-directional continuity data, storing the bi-directional continuity data, searching for bi-directional continuity data, analyzing the determined continuity data, continually determining the bi-directional continuity, and self-diagnosing said cable tester.

30. The method of claim 29, further including the step of
- operator selecting a plurality of said modes to be sequentially executed.

31. The method of claim 29, further including the step of
- providing at least one of the steps of displaying the image of the connector of said cable-under-test and displaying text relative to said cable-under-test.

32. Apparatus for testing a cable-under-test having a plurality of connector ends, comprising:
- means for providing a selected stimulus signal;
- an input shift register for sequentially providing said stimulus signal to a plurality of terminals, wherein at least two connector ends of said cable-under-test are connected to said plurality of terminals;
- an output shift-register connected to said plurality of terminals, for providing a response signal according to signals received from said terminals; and
- means for generating cable data according to said selected stimulus signal and said response signal.

33. The apparatus of claim 32, further including
- a plurality of analog gates for selectively providing said selected stimulus signal to said plurality of terminals according to control signals provided by said input shift register.

* * * * *